US009125311B2

(12) United States Patent
Ueda et al.

(10) Patent No.: US 9,125,311 B2
(45) Date of Patent: Sep. 1, 2015

(54) HOLLOW SEALING STRUCTURE

(71) Applicant: NEC Corporation, Tokyo (JP)

(72) Inventors: Takashi Ueda, Tokyo (JP); Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/232,591

(22) PCT Filed: Sep. 21, 2012

(86) PCT No.: PCT/JP2012/074184
§ 371 (c)(1),
(2) Date: Jan. 13, 2014

(87) PCT Pub. No.: WO2013/047354
PCT Pub. Date: Apr. 4, 2013

(65) Prior Publication Data
US 2014/0166352 A1   Jun. 19, 2014

(30) Foreign Application Priority Data
Sep. 26, 2011   (JP) ................. 2011-208642

(51) Int. Cl.
H05K 5/06         (2006.01)
H01L 23/10        (2006.01)
H01L 23/08        (2006.01)
H01L 23/043       (2006.01)

(52) U.S. Cl.
CPC ............. *H05K 5/065* (2013.01); *H01L 23/10* (2013.01); *H01L 23/043* (2013.01); *H01L 23/08* (2013.01); *H01L 2224/32225* (2013.01); *H01L 2224/48091* (2013.01); *H01L 2224/48227* (2013.01);

(Continued)

(58) Field of Classification Search
CPC ....... H01L 23/02; H01L 23/04; H01L 125/04; H01L 25/18; H01L 23/00; H01L 23/14; H01L 23/08; H01L 23/52; H01L 21/52; H05K 9/00; H05K 5/065; H03B 5/32
USPC ........ 174/50.52, 258; 156/250, 297; 157/327; 257/664; 438/113
See application file for complete search history.

(56) References Cited

U.S. PATENT DOCUMENTS

2005/0260797 A1* 11/2005 Farrell et al. .................. 438/113
2006/0157573 A1*  7/2006 Nishizawa et al. ........... 235/492

(Continued)

FOREIGN PATENT DOCUMENTS

JP   S6240750  A  *  2/1987
JP   02029104  A  *  1/1990  ............... H03B 5/32
JP   6-281210  A     10/1994

(Continued)

OTHER PUBLICATIONS

International Search Report in PCT/JP2012/074184 dated Oct. 23, 2012.

*Primary Examiner* — Timothy Thompson
*Assistant Examiner* — Guillermo Egoavil
(74) *Attorney, Agent, or Firm* — McGinn IP Law Group, PLLC

(57) ABSTRACT

A hollow sealing structure includes a substrate, an element part provided on a first surface of the substrate, a cap that covers the element part, and a resin layer that covers the cap. The substrate includes a positioning part positioning the cap. The cap includes a fixation part being arranged at the positioning part and fixing the cap on the substrate. The resin layer is connected to the positioning part and the fixation part.

5 Claims, 11 Drawing Sheets

(52) U.S. Cl.
CPC ......... *H01L2224/73265* (2013.01); *H01L 2224/8385* (2013.01); *H01L 2224/83801* (2013.01)

(56) References Cited

U.S. PATENT DOCUMENTS

2009/0288852 A1* 11/2009 Hirokawa et al. .......... 174/50.52
2011/0127655 A1* 6/2011 Fujii .............................. 257/664

FOREIGN PATENT DOCUMENTS

| JP | 9-22954 A | | 1/1997 | |
| --- | --- | --- | --- | --- |
| JP | 2000-174151 A | | 6/2000 | |
| JP | 2002110833 A | * | 4/2002 | ............. H01L 23/02 |
| JP | 2002-231843 A | | 8/2002 | |
| JP | 2008-60289 A | | 3/2008 | |
| JP | 2009-283553 A | | 12/2009 | |
| JP | 2011100825 A | * | 5/2011 | |
| JP | 2013069961 A | * | 4/2013 | |

* cited by examiner

HOLLOW SEALING STRUCTURE

TECHNICAL FIELD

The present invention relates to a hollow sealing structure that seals an element part provided on a substrate, in a hollow space.

BACKGROUND ART

Communication devices used in a high frequency band such as BS/CS broadcasting devices, microwave communication devices, and radar devices are increasingly used in recent years. In general, with a higher frequency, energy attenuation of electromagnetic wave becomes greater when propagating through a substance having a high relative permittivity. As a result, there is a problem of deteriorated communication performance. For this reason, in an electronic component of a communication device, there has been employed an airtight sealing structure in which an air layer, which has a low relative permittivity, is formed around an element part of an electronic component to thereby seal it in a hollow space, in order to sufficiently bring out its high frequency characteristic.

In electronic components, there are required various types of characteristics including high performance, superior reliability, miniaturization, and cost reduction. In addition to improvements to the element part itself, there is a need for improving the package that seals an element in a hollow space (hollow sealing structure). Examples of requirements for a hollow sealing structure include superior air tightness, cost reduction, and ensuring sufficient mounting area.

As a hollow sealing structure that seals an element part in a hollow space, for example, a hollow sealing structure proposed in Patent Document 1 includes a substrate, an element part provided on the substrate, a resin cap that covers and hollow-seals the element part, and an adhesion part that adheres the resin cap onto the substrate. The resin cap has a fixation film.

A configuration proposed in Patent Document 2 includes a substrate, an element part provided on the substrate, and a cap that covers and hollow-seals the element part. On the substrate, there is provided a step for positioning the cap.

Moreover, a configuration proposed in Patent Document 3 includes a substrate with a hole formed therein, an element part provided on the substrate, and a cap that hollow-seals the element part and that has a projection part provided thereon. The projection part of the cap is arranged in the hole of the substrate and fixes the cap.

PRIOR ART DOCUMENTS

Patent Documents

[Patent Document 1] Japanese Unexamined Patent Application, First Publication No. 2009-283553
[Patent Document 2] Japanese Unexamined Patent Application, First Publication No. 2008-60289
[Patent Document 3] Japanese Unexamined Patent Application, First Publication No. H09-22954

SUMMARY OF THE INVENTION

Problem to be Solved by the Invention

In the hollow sealing structure disclosed in Patent Document 1, the position of the cap may deviate from a predetermined position in some cases when fixing the cap on the substrate. In this case, outside air or a fixation film resin may infiltrate into the interior of the hollow-sealed cap in some cases. In this case, there is a problem in that air tightness of the hollow part cannot be maintained, and the high frequency characteristic becomes deteriorated.

Moreover, the configuration uses an expensive film resin to fix the cap, and this results in a problem of increased cost.

Furthermore, in a case where the cap is fixed by means of soldering or an adhesive agent, the solder or the adhesive agent infiltrates onto the substrate within the hollow-sealed cap. As a result, there is a problem in that the area on the hollow-sealed substrate for mounting an electronic component and wiring becomes reduced.

For the above problem of the deviated cap position, it may be considered to suppress positional deviation by providing a configuration of providing a step on the substrate as with Patent Document 2, or forming a hole in the substrate and inserting the projection part of the cap into the hole as with the Patent Document 3. However, due to insufficient strength after fixation, there is a problem in that air inside the hollow-sealed part leaks.

The present invention has been conceived in view of the above circumstances. An exemplary object of the invention is to provide a hollow sealing structure that achieves superior tight adhesion between a substrate, and a cap and a resin layer that seal an element part provided on the substrate while achieving highly reliable hollow sealing, and that can be manufactured at low cost.

Means for Solving the Problem

In order to solve the above problem, a hollow sealing structure according to an exemplary aspect to the present invention includes a substrate, an element part provided on a first surface of the substrate, a cap that covers the element part, and a resin layer that covers the cap. The substrate includes a positioning part positioning the cap. The cap includes a fixation part being arranged at the positioning part and fixing the cap on the substrate. The resin layer is connected to the positioning part and the fixation part.

Effect of the Invention

According to the hollow sealing structure of the exemplary aspect of the present invention, it is configured so that the fixation part of the cap is arranged at the positioning part provided on the substrate, and thereby the cap is fixed on the substrate. With this configuration, superior tight adhesion can be achieved between the substrate and the resin layer without positional deviation occurring when the cap is covered with the resin layer, and the reliability of the hollow sealing can be improved.

Furthermore, the resin layer is configured to be connected to the positioning part and the fixation part. With this configuration, tight adhesion between the substrate and the resin layer, and tight adhesion between the fixation part and the resin layer become stronger. As a result, it is possible to maintain the hollow sealing even when a pressure is applied from the outside.

Moreover, the resin layer that covers the cap is configured with an inexpensive resin layer, and therefore, the hollow sealing structure can be manufactured at low cost.

Furthermore, the cap that is retained on the substrate is configured to be covered with the resin layer. With this configuration, it is possible to suppress the resin from infiltrating to the hollow-sealed substrate, and ensure a sufficient area for mounting an electronic component and wiring to be arranged on the substrate within the hollow sealing structure.

EMBODIMENTS FOR CARRYING OUT THE INVENTION

Hereunder exemplary embodiments of the present invention are described, with reference to the accompanying drawings.

The exemplary embodiments of the present invention relate to a hollow sealing structure that seals an element part provided on a substrate, using a cap and a resin.

Figure 1A:
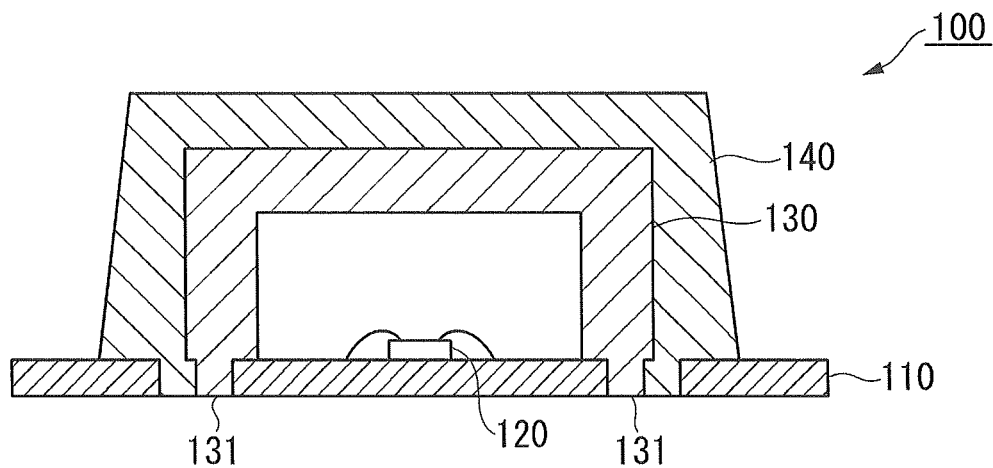
FIG. 1A is a longitudinal sectional view of a hollow sealing structure according to a first exemplary embodiment of the present invention.
Figure 1B:
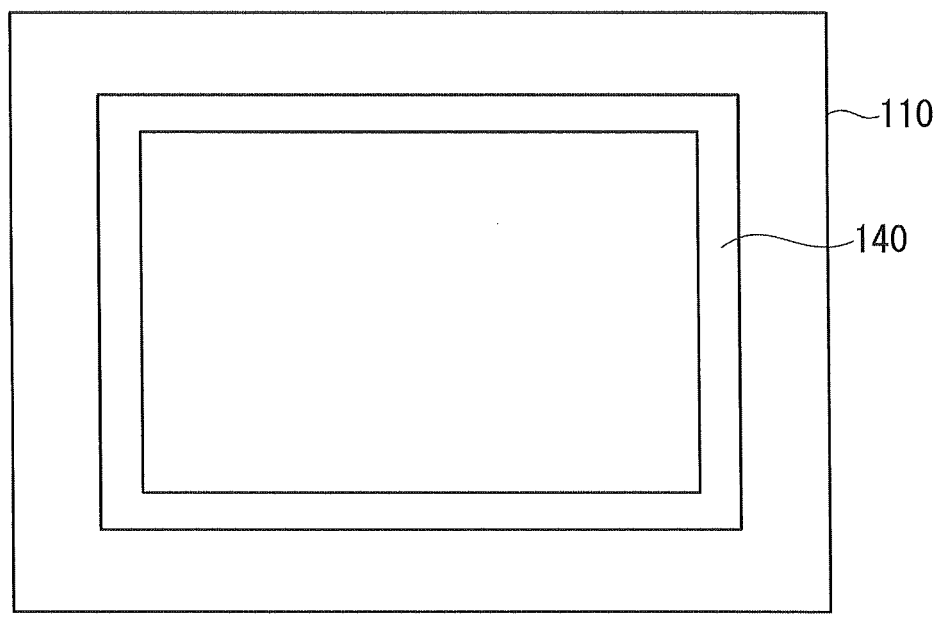
FIG. 1B is a plan view of the hollow sealing structure according to the first exemplary embodiment of the present invention.

As shown in FIG. 1A and FIG. 1B, a hollow sealing structure 100 of a first exemplary embodiment of the present invention includes a substrate 110, an element part 120, a cap 130, and a resin layer 140. The element part 120 is provided on an upper surface (one surface, first surface) of the substrate 110. The cap 130 is arranged so as to cover the element part 120. The resin layer 140 covers the cap 130.

The substrate 110 is a plate-shaped component that forms an electronic circuit. On a surface of the substrate 110 there are fixed the element part 120 and an electronic component. The substrate 110, the element part 120 and the electronic component are connected by a wiring on the substrate 110. As the substrate 110, there may be used, for example, a resin material such as glass epoxy or a flexible substrate, which has superior flexibility. At two predetermined locations on the substrate 110, there are provided cylinder-shaped through holes (positioning parts, holes). The cap 130 and the resin layer 140 are arranged in these through holes.

The element part 120 is provided on the substrate 110. The element part 120 is fixed on the substrate 110, for example, by means of soldering or an electrically conductive adhesive agent. The element part 120 is electrically connected to the wiring formed on the substrate 110.

In the present exemplary embodiment, the element part 120 is electrically connected to the substrate 110 by means of a bonding wire.

Figure 2A:
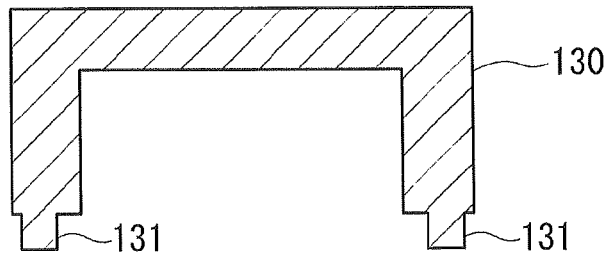
FIG. 2A is a longitudinal sectional view of a cap according to the first exemplary embodiment of the present invention.
Figure 2B:
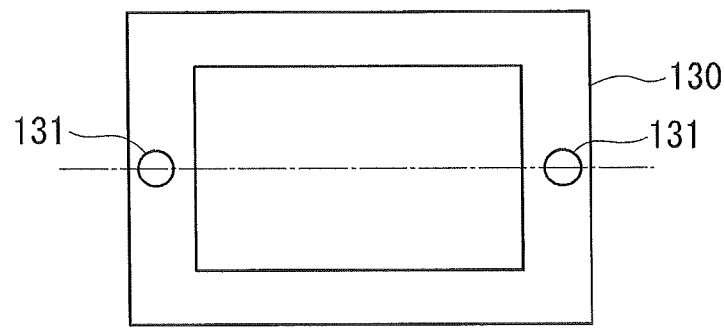
FIG. 2B is a bottom view of the cap according to the first exemplary embodiment of the present invention.

As shown in FIG. 2A and FIG. 2B, the cap 130 has a box shape that opens downward. The cap 130 is arranged so as to cover the element part 120. The cap 130 has a box shape with a sufficient space therein so that it will not physically come in contact with the element part 120 and the bonding wire. An end surface of the cap 130 (a surface on which the substrate 110 and the cap 130 are in contact with each other) is a flat surface. The cap 130 is formed, for example, with a resin material, a metal material, or a ceramic material. In particular, in a case where the cap 130 is formed with the same material as that of the resin layer 140, there is no difference in the thermal expansion coefficient between the cap 130 and the resin layer 140. Accordingly, in the case of this configuration, interfacial separation caused by thermal expansion coefficient differential between the cap 130 and the resin layer 140 is suppressed.

Figure 3:
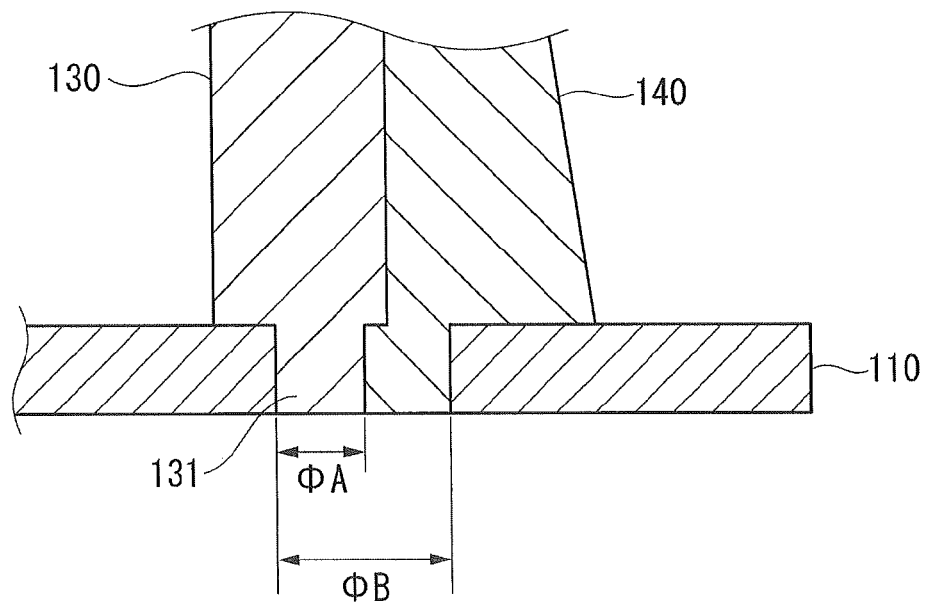
FIG. 3 is an enlarged view of the periphery of a through hole of the first exemplary embodiment of the present invention.

In the present exemplary embodiment, at two locations below the cap 130 (on the end surface of the cap 130), there is formed a cylinder-shaped projection part 131 so as to correspond to the through holes of the substrate 110. The size of this projection part 131 (φA shown in FIG. 3) is smaller than the size of the through hole (φB shown in FIG. 3). Therefore, a gap (φB−φA) is formed when the projection part 131 is inserted into the through hole. When the projection part 131 is inserted into the through hole, the projection part 131 fixes the cap 130. Each projection part 131 is provided near the outside of the end surface of the cap 130 (the opposite side to the element part 120).

The cylinder-shaped projection part 131 may be of a tapered shape with the upper and lower diameters different.

The center of the projection part 131 and the center of the through hole of the substrate 110 may be coaxial with each other.

The resin layer 140 is arranged so as to cover the cap 130 and the projection part 131 of the cap 130. The resin layer 140 is formed, for example, with a thermosetting resin or a thermoplastic resin. The resin layer 140 is tightly adhered to the substrate 110, hollow-sealing the element part 120. Outside air does not flow into the interior of the hollow sealing structure 100, in which the element part 120 is hollow-sealed by the cap 130 and the resin layer 140. If outside air flowed into the interior of the hollow sealing structure 100, the humidity in the outside air would deteriorate the element part 120 and the wiring, and cause reduced performance of the electric component, so that the inherent performance would not be achieved.

Hereunder is a description of a manufacturing method of the hollow sealing structure 100 of the present exemplary embodiment configured in the above manner.

Figure 4A:
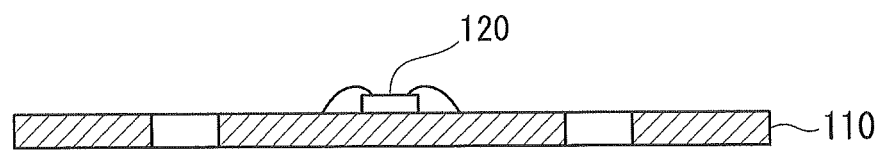
FIG. 4A is a longitudinal sectional view of an element part arranged on a substrate in the first exemplary embodiment of the present invention.
Figure 4B:
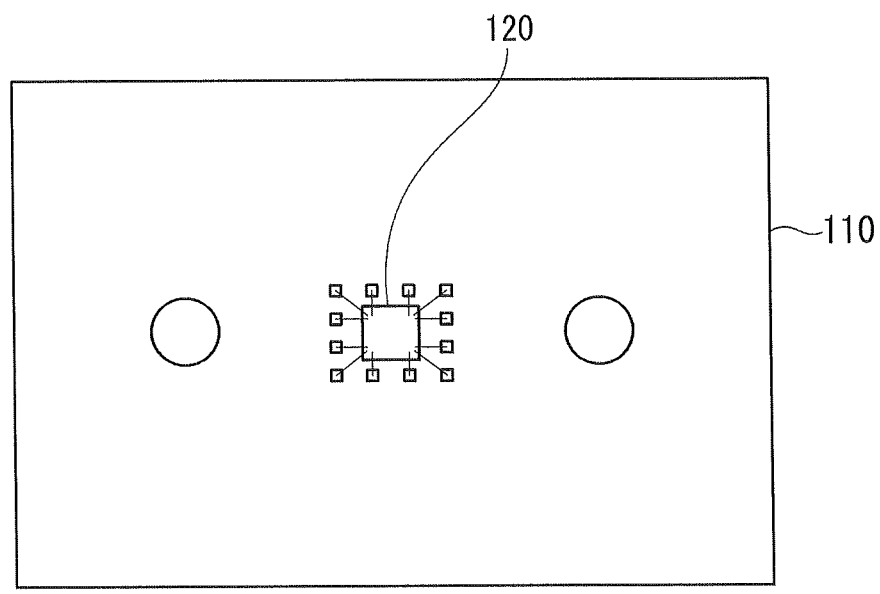
FIG. 4B is a plan view of the element part arranged on the substrate in the first exemplary embodiment of the present invention.
Figure 5A:
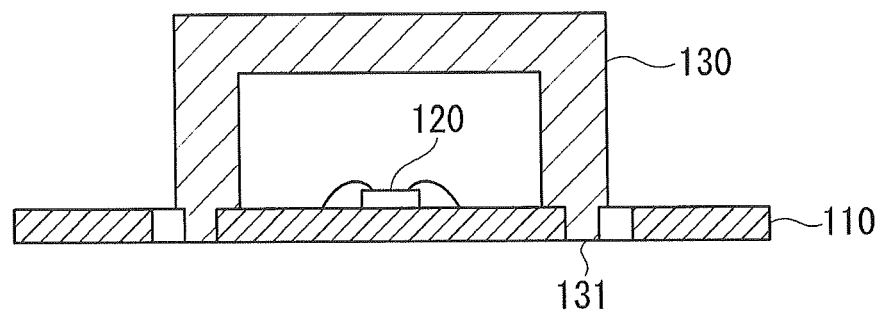
FIG. 5A is a longitudinal sectional view of the cap arranged on the substrate in the first exemplary embodiment of the present invention.
Figure 5B:
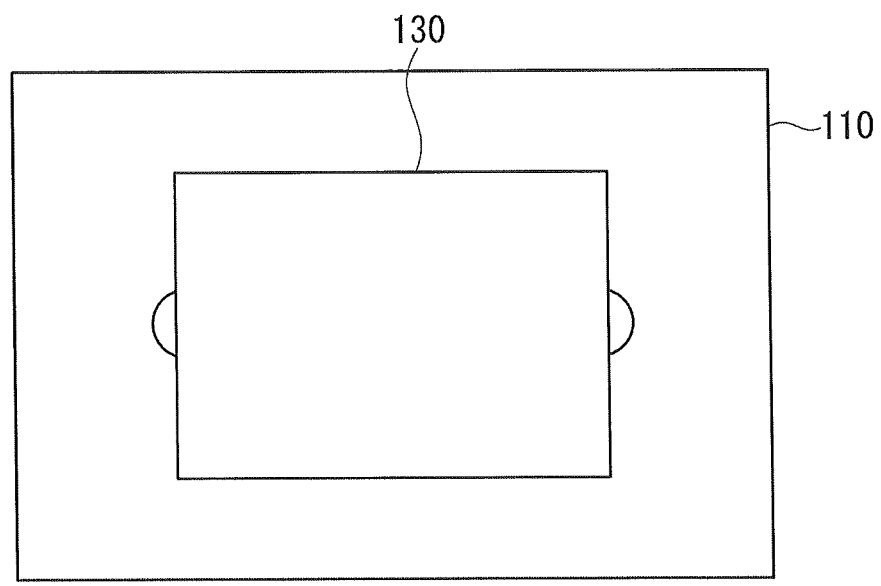
FIG. 5B is a plan view of the cap arranged on the substrate in the first exemplary embodiment of the present invention.

First, as shown in FIG. 4A and FIG. 4B, a predetermined wiring of the substrate 110 and the element part 120 are wire-bonded on the substrate 110 by means of soldering. Through this process, the substrate 110 and the element part 120 are electrically connected while fixing the element part 120 on the substrate 110. Then, as shown in FIG. 5A and FIG. 5B, the projection parts 131 provided on the cap 130 are inserted into the through holes of the substrate 110 to fix the cap 130 on the substrate 110.

At this time, the projection part 131 is in contact with the side of the through hole outer diameter that is closest to the element part 120, allowing the cap 130 to be fixed on the substrate 110.

Next, the resin layer 140 is formed over the cap 130. In the present exemplary embodiment, the resin layer 140 is formed by means of a transfer molding method (injection molding). The transfer molding method refers to a resin processing method in which molding is performed by applying a pressure to a resin that has been heated to a softening temperature to press and fill it into a mold.

Figure 6A:
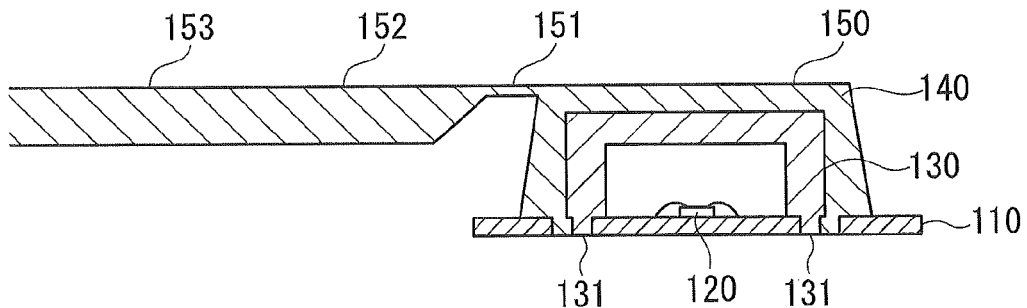
FIG. 6A is a schematic explanatory diagram of a transfer molding method in the first exemplary embodiment of the present invention.
Figure 6B:
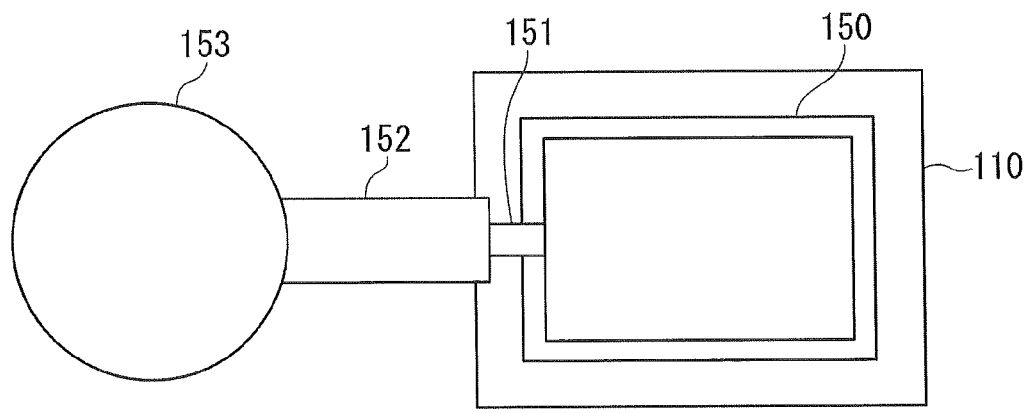
FIG. 6B is a schematic explanatory diagram of the transfer molding method in the first exemplary embodiment of the present invention.

In order to form the resin layer 140 by means of the transfer molding method, as shown in FIG. 6A and FIG. 6B, there is arranged a transfer molding mold (hereunder, referred to as a mold) 150 so as to cover the cap 130, together with a gate 151 of a resin injection port, a runner 152 of a resin inflow path, and a cull 153 that feeds resin to the runner 152. In the present exemplary embodiment, the mold 150 has a trapezoidal shape when viewed in a vertical cross-sectional view as shown in FIG. 6A. The thickness of the molded resin layer 140 is greater at the side where it comes in contact with the substrate 110. The thickness of the resin layer 140 becomes thinner with approach to the upper side thereof. The gate 151 is a side gate provided on a side.

The resin that has been fed from the cull 153 is injected into a space region (gap) between the cap 130 and the injection molding mold 150 and formed so as to cover the cap 130, thereby hollow-sealing the element part 120 therein. At this time in the through hole, as shown in FIG. 2A and FIG. 2B, the resin layer 140 is formed also in the space in the gap between the projection part 131 of the cap 130 and the through hole (φB−φA shown in FIG. 3).

Parameters at the time of performing the transfer molding method include resin injection pressure of 3.25 MPa, injection speed at 10 min/sec, and resin temperature at 175° C. As parameters of this injection, optimum parameters may be appropriately selected according to the strength of the cap 130 and the allowable temperature of the element part 120.

According to the hollow sealing structure 100 of the present exemplary embodiment, the projection part 131 of the cap 130 is arranged in the through hole provided in the substrate 110, and thereby the cap 130 is fixed on the substrate 110. With this configuration, position deviation does not occur when covering the cap 130 with the resin layer 140 by means of the transfer molding method. As a result, it is possible to achieve superior tight adhesion between the substrate 110 and the resin layer 140, and improve the reliability of the hollow sealing of the element part 120.

Furthermore, the resin layer 140 is formed also in a gap between the through hole and the projection part 131 of the cap. With this configuration, tight adhesion between the cap 130 and the resin layer 140, and tight adhesion between the substrate 110 and the resin layer 140 become stronger. As a result, even in a case where pressure is applied from the outside of the resin layer 140, the hollow sealing can be maintained and the reliability thereof can be improved.

Moreover, in the present exemplary embodiment, an end surface of the cap 130 that comes in contact with the substrate 110 is a flat surface. With this configuration, the cap 130 can be tightly adhered to the substrate 110 sufficiently, and the reliability of the hollow sealing structure can be improved.

Furthermore, in the present exemplary embodiment, the resin layer 140 that covers the cap 130 is formed by means of the transfer molding method, and it is therefore possible to form the resin layer 140 at low cost.

Moreover, the cap 130 that is retained on the substrate 110 is covered with the resin layer 140. With this configuration, it is possible to suppress the resin from infiltrating to the hollow-sealed space, and ensure a sufficient area for mounting the element part 120 and wiring on the substrate 110 within the hollow-sealed space.

In the exemplary embodiment described above, there has been described the case where the positioning part is of a cylinder-shaped through hole. However, it is not limited to this configuration. The through hole may be a rectangular hole or a square hole. Moreover, the positioning part does not have to be a through hole, and it may be a bottomed hole (concave) that is provided in the substrate 110.

The projection part 131 may be of a shape other than that described above. Examples of the shape of the projection part 131 being different from that of the exemplary embodiment described above, are described below in detail as modified example 1 to modified example 4.

Configurations are the same as those of the first exemplary embodiment described above except for the shape of the projection part 131 being different. Therefore, the same reference symbols are given to the same components, and detailed descriptions thereof are omitted. The manufacturing method of the hollow sealing structure 100 is also similar to that in the above exemplary embodiment, and therefore the detailed description thereof is omitted.

Modified Example 1

Figure 7A:
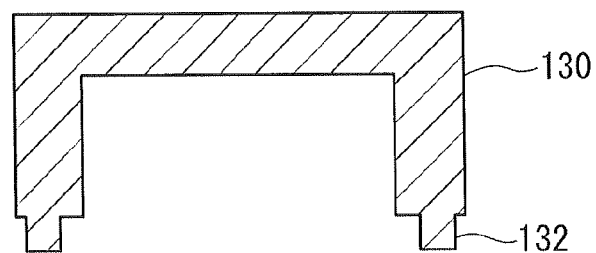
FIG. 7A is a schematic explanatory diagram of modified example 1 of the first exemplary embodiment of the present invention.
Figure 7B:
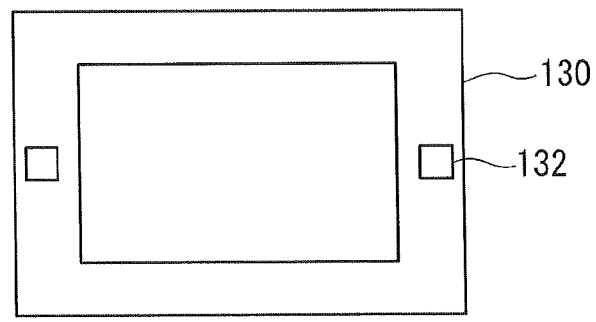
FIG. 7B is a schematic explanatory diagram of modified example 1 of the first exemplary embodiment of the present invention.

In modified example 1, a projection part 132 has a square column shape as shown in FIG. 7A and FIG. 7B. As with the case of the cylinder shape, the square column-shaped projection part 132 may have a tapered shape with the upper and lower dimensions different. In the case where the projection part 132 is of a square column shape, the shape of the positioning part on the substrate 110 side may be a different shape that differs from the shape of the projection part 132, such as circular hole or a square hole, provided that positioning is achieved by insertion.

According to the hollow sealing structure with the projection part 132 being of a square column shape, the area of the projection part 132 which comes in contact with the through hole increases. Accordingly, the cap 130 is strongly fixed on the substrate 110, and position deviation can be suppressed at the time of forming a resin layer 140 by means of the transfer molding method. Further, the substrate 110 and the resin (resin layer 140) can be tightly adhered with each other more strongly. As a result, reliability of hollow sealing can be improved.

Modified Example 2

Figure 8A:
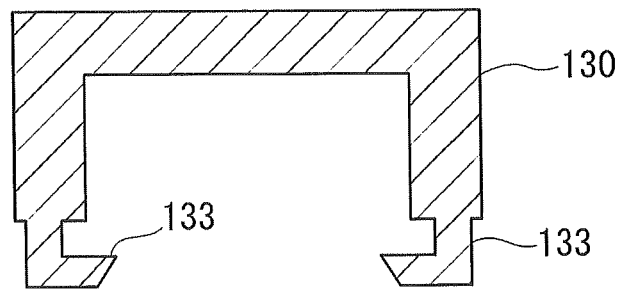
FIG. 8A is a schematic explanatory diagram of modified example 2 of the first exemplary embodiment of the present invention.
Figure 8B:
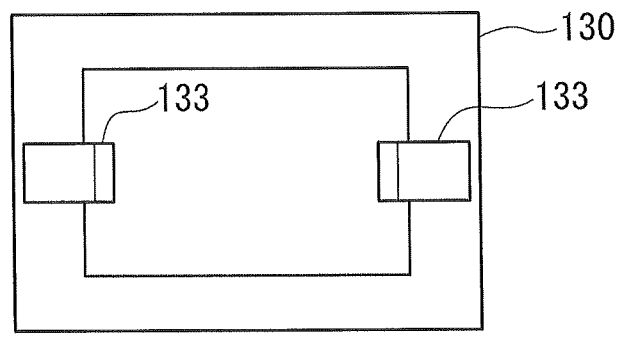
FIG. 8B is a schematic explanatory diagram of modified example 2 of the first exemplary embodiment of the present invention.
Figure 8C:
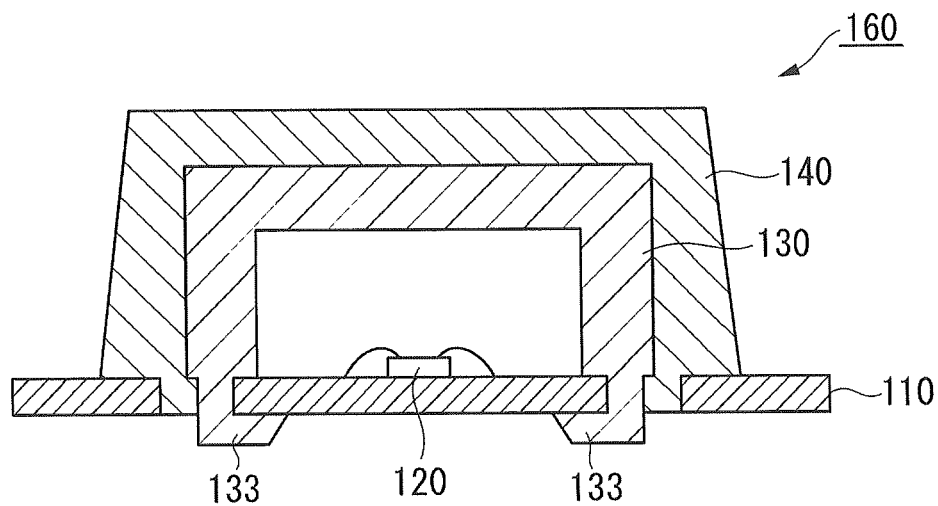
FIG. 8C is a schematic explanatory diagram of modified example 2 of the first exemplary embodiment of the present invention.

In modified example 2, as shown in FIG. 8A through FIG. 8C, projection parts 133 pass through the through holes of the substrate 110, and have a latch shape that extends parallel with the substrate 110. An end surface of the projection part 133 has a shape that extends diagonally upward from the lower surface of the projection part 133 toward the back surface of the substrate 110. The surface of the projection part 133 that comes in contact with the back surface of the substrate 110 is a flat surface. The cap 130 can be fixed on the substrate 110 by inserting the projection parts 133 of the cap 130 into the through holes of the substrate 110, and contacting the upper surface of the latches with the back surface of the substrate 110 to engage with the substrate 110.

According to the hollow sealing structure 160 with the projection parts 133 being of a latch shape, the projection parts 133 engage with the substrate 110 on the back surface of the substrate 110. With this configuration, the cap 130 is fixed more strongly on the substrate 110, and position deviation can be suppressed at the time of forming a resin layer 140 by means of the transfer molding method. As a result, it is possible to achieve stronger tight adhesion between the substrate 110 and the resin (resin layer 140), and improve the reliability of the hollow sealing.

Moreover, since the projection parts 133 are of a latch shape, the position of the cap 130 will not deviate upward, and the resin is unlikely to infiltrate through the gap between the cap 130 and the substrate 110. As a result, leakage of the hollow sealing structure 160 can be suppressed, and the area for mounting wiring and an element part 120 can be ensured.

Furthermore, the latch shape of the projection part 133 is of a shape that extends diagonally upward from the lower surface of the projection part 133 toward the back surface of the substrate 110. Accordingly, the projection part 133 can be easily inserted into the through hole when inserting the projection part 133 of the cap 130 into the through hole, and the projection part 133 is unlikely to exit from the through hole. As a result, it achieves superior workability.

Modified Example 3

Figure 9A:
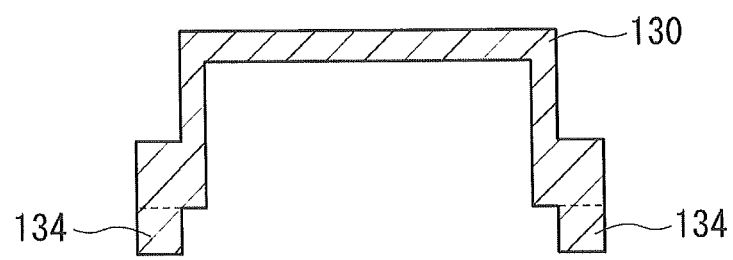
FIG. 9A is a schematic explanatory diagram of modified example 3 of the first exemplary embodiment of the present invention.
Figure 9B:
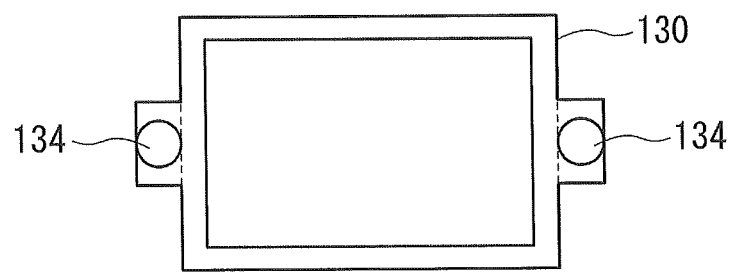
FIG. 9B is a schematic explanatory diagram of modified example 3 of the first exemplary embodiment of the present invention.

Modified example 3, as shown in FIG. 9A and FIG. 9B, is of a configuration in which the thickness of the cap 130 is thicker at two locations, and a cylinder-shaped projection part 134 is provided on the end surface at each thicker location (the surface that comes in contact with the substrate 110). That is to say, the width of the two locations of the side surfaces of the cap 130 (width of the portion that connects to the projection part 134) is greater than the width of the side surfaces of the other portion of the cap 130.

If the thickness of the cap 130 is uniform, then the thickness of the cap 130 will be required to be greater than or equal to the dimension (diameter) of the projection part 134, and as a result of this, the outer dimension of the cap 130 may become large. On the other hand, in the case of the cap 130 and the projection part 134 of the configuration in modified example 3, even if the thickness of the cap 130 is made thin, a contact area can be sufficiently ensured between the end surface of the cap 130 and the upper surface of the substrate 110, and it is possible to suppress the resin from infiltrating into the hollow-sealed space.

Moreover, since it is possible to make the thickness of the cap 130 thin, cost of the cap 130 can be reduced.

In modified example 3, there has been described the case where the projection part 134 is of a cylinder shape. However, the projection part 134 may be of a square column shape or a latch shape.

Modified Example 4

Figure 10A:
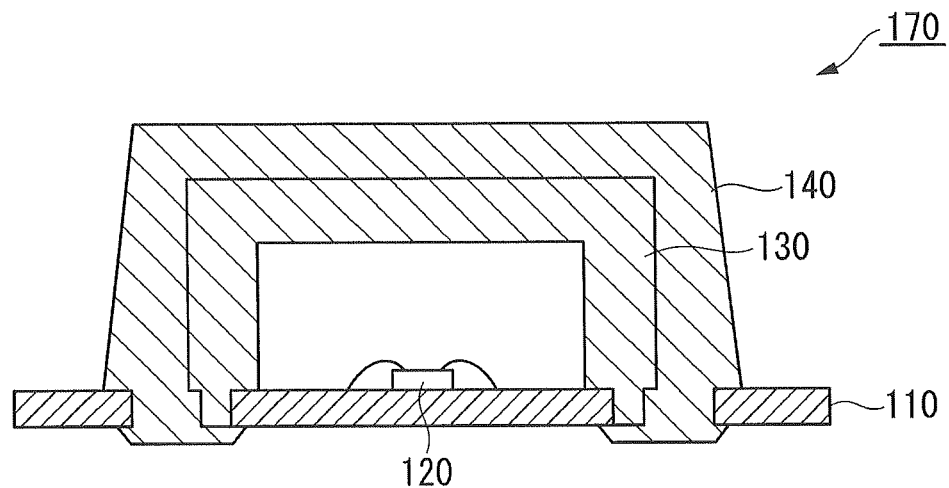
FIG. 10A is a schematic explanatory diagram of modified example 4 of the first exemplary embodiment of the present invention.
Figure 10B:
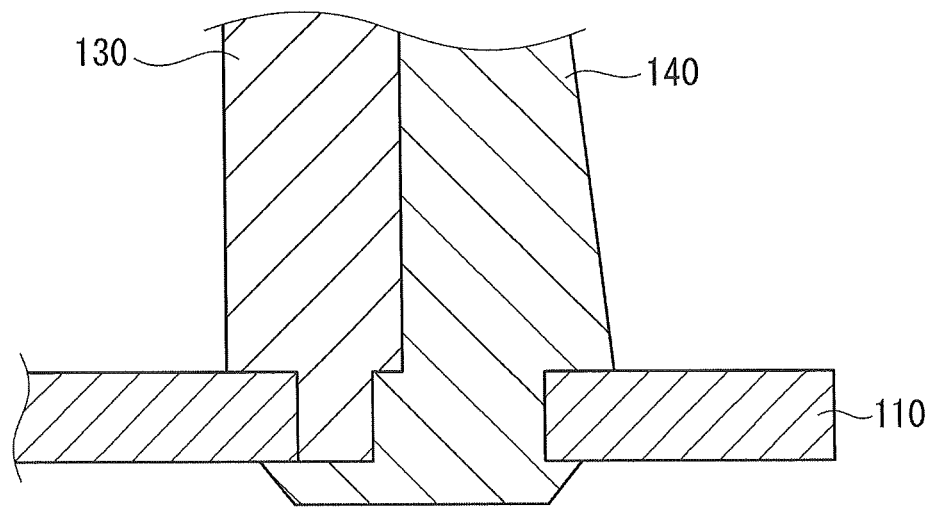
FIG. 10B is a schematic explanatory diagram of modified example 4 of the first exemplary embodiment of the present invention.

In modified example 4, as shown in FIG. 10A and FIG. 10B, a resin layer 140 entirely covers the outer surface of a cap 130 and fills through holes of the cap 130, and it further goes around to the lower surface (the other surface (second surface), which is an opposite surface of the one surface) side of the substrate 110. In order to form the resin layer 140, there may be arranged a molding mold on the lower surface of the substrate 110 so as to form the resin layer 140 shown in FIG. 10A and FIG. 10B. According to the resin layer 140 of this type of configuration, it is possible to tightly adhere and fix the cap 130 strongly, and improve the reliability of a hollow sealing structure 170.

In modified example 4, there has been described the case where the resin layer 140 is formed on the lower surface of the substrate 110 through the hole in the substrate 110, through which the cap 130 is inserted. As another configuration, another through hole may be provided in the substrate 110, and the resin layer 140 may go around to the lower surface of the substrate 110 therethrough to thereby fix the cap 130.

In the above exemplary embodiment, there has been described the configuration in which the projection part (fixation part) 131 provided on the cap 130 is inserted through the through hole (positioning part) that is formed in the substrate 110 to thereby fix the cap 130. As another configuration, a projection part formed on the substrate may engage with a concave part formed in the cap to thereby fix the cap on the substrate. This exemplary embodiment is described hereunder in detail as a second exemplary embodiment.

Figure 11A:
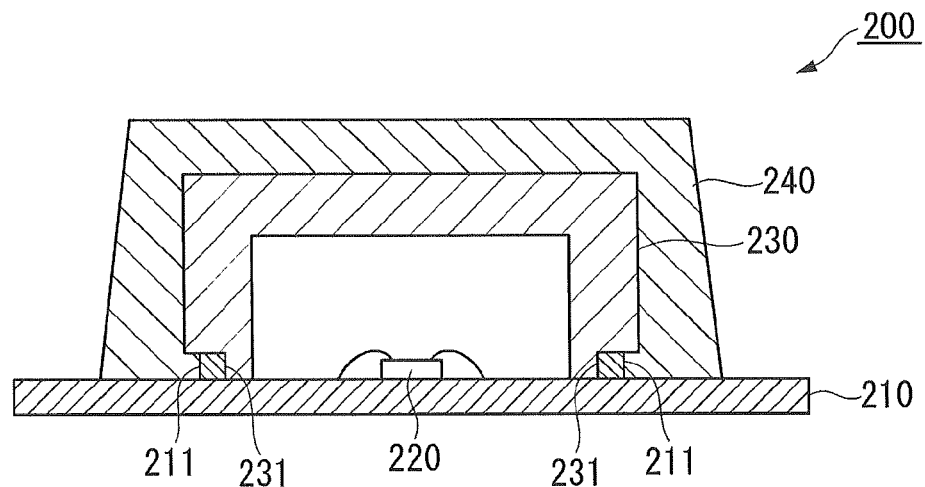
FIG. 11A is a longitudinal sectional view of a hollow sealing structure according to a second exemplary embodiment of the present invention.
Figure 11B:
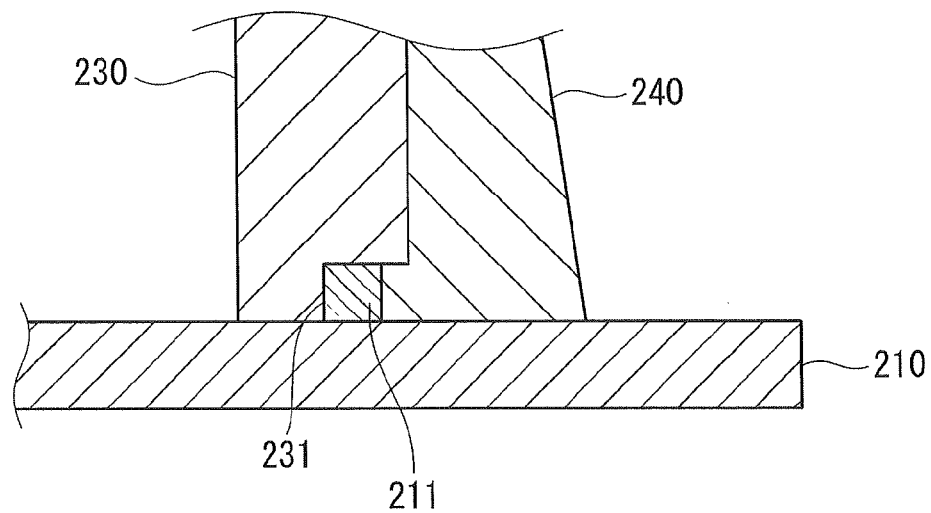
FIG. 11B is an enlarged view of the periphery of a projection part in the second exemplary embodiment of the present invention.

As shown in FIG. 11A and FIG. 11B, a hollow sealing structure 200 of the second exemplary embodiment includes a substrate 210, an element part 220, a cap 230, and a resin layer 240. The element part 220 is provided on the substrate 210. The cap 230 is arranged so as to cover the element part 220. The resin layer 240 covers the cap 230.

The substrate 210 is a plate-shaped component that forms an electronic circuit. On a surface of the substrate 210, there are fixed the element part 220 and an electronic component. The substrate 210, the element part 220 and the electronic component are connected by a wiring on the substrate 210. As the substrate 210, there may be used, for example, a resin material such as glass epoxy or a flexible substrate, which has superior flexibility. At two predetermined locations on the substrate 210, there is formed a projection part 211. Each projection part 211 fixes the cap 230 and the resin layer 240.

The element part 220 is provided on the substrate 210. The element part 220 is fixed on the substrate 210, for example, by means of soldering or an electrically conductive adhesive agent. The element part 220 is electrically connected to the wiring formed on the substrate 210. In the present exemplary embodiment, the element part 220 is electrically connected to the substrate 210 by means of a bonding wire.

The cap 230 has a box shape that opens downward. The cap 230 is arranged so as to cover the element part 220. An end surface of the cap 230 (a surface on which the cap 230 and the substrate 110 are in contact with each other) is a flat surface. The cap 230 has a box shape with a sufficient space therein so that it will not physically come in contact with the element part 220 and the bonding wire. The cap 230 is formed, for example, with a resin material, a metal material, or a ceramic material.

In particular, in a case where the cap 230 is formed with the same material as that of the resin layer 240, there is no difference in the thermal expansion coefficient between the cap 230 and the resin layer 240. Accordingly, in the case of this configuration, interfacial separation caused by thermal expansion coefficient differential between the cap 230 and the resin layer 240 is suppressed.

In the present exemplary embodiment, at two locations below the cap 230 (on the end surface of the cap 230), there are formed concave parts 231 so as to correspond to the projection parts 211 provided on the substrate 210. Each concave part 231 is a portion where the lower end part of the side surface of the cap 230 is partly recessed. As shown in FIG. 11A and FIG. 11B, each projection part 211 is provided near the outside of the end surface of the cap 230 (the opposite side to the element part 220). On the element part 220 side of the projection part 211, there is arranged the concave part 231 of the cap 230. On the opposite side of the element part 220 side of the projection part 211, there is arranged the resin layer 240.

When the concave part 231 engages with the projection part 211, movement of the concave part 231 is restricted by the projection part 211, and the cap 230 is thereby fixed on the substrate 210.

The projection part 211 may be of a cylinder shape or a square column shape. The projection part 211 may be of a tapered shape with the diameters of the upper surface and lower surface different. The projection part 211 may be of a frame shape that protrudes from the mounting surface of the substrate 110.

The resin layer 240 is arranged so as to cover the cap 230 and the projection part 211 of the cap 210. The resin layer 240 is formed, for example, with a thermosetting resin or a thermoplastic resin. The resin layer 240 is tightly adhered to the substrate 210, hollow-sealing the element part 220. Outside air does not flow into the interior of the hollow sealing structure 200, in which the element part 220 is hollow-sealed by the cap 230 and the resin layer 240. If outside air flowed into the interior of the hollow sealing structure 200, then humidity in the outside air would deteriorate the element part 220 and the wiring, and cause reduced performance of the electric component, so that the inherent performance would not be achieved.

Hereunder is a description of a manufacturing method of the hollow sealing structure 200 of the present exemplary embodiment configured in the above manner.

First, a predetermined wiring of the substrate 210 and the element part 220 are wire-bonded on the substrate 210 by means of soldering. Through this process, the substrate 210 and the element part 220 are electrically connected while fixing the element part 220 on the substrate 210. Then, the projection part 211 provided on the substrate 210 is engaged with the concave part 231 of the cap 230 to thereby fix the cap 230 on the substrate 210.

Next, the resin layer 240 is formed on the cap 230 by means of a transfer molding method. The method of performing the transfer molding method is the same as that of the performing method described in the above exemplary embodiment, and therefore detailed description is omitted. The resin layer 240 is formed so as to cover the cap 230, and the resin layer 240 is formed also in a region surrounded by the projection parts 211 and the concave parts 231.

According to the hollow sealing structure 200 of the second exemplary embodiment, the concave part 231 of the cap 230 engages with the projection part 211 provided on the substrate 210, and thereby the cap 230 is fixed on the substrate 210. With this configuration, position deviation does not occur when covering the cap 230 with the resin layer 240 by means of the transfer molding method, and superior tight adhesion can be achieved between the substrate 210 and the resin layer 240. As a result, it is possible to reliably hollow-seal the element part 220, and improve the reliability of the hollow sealing.

Furthermore, the resin layer 240 is configured so as to be formed also around the periphery of the projection part 211 of the substrate 210 and of the concave part 231 of the cap 230. With this configuration, tight adhesion between the cap 230 and the resin layer 240, and tight adhesion between the substrate 210 and the resin layer 240 become stronger. As a result, even in a case where pressure is applied from the outside of the resin layer 240, the hollow sealing can be maintained and the reliability thereof can be improved.

Furthermore, in the present exemplary embodiment, the resin layer 240 that covers the cap 230 is formed by means of the transfer molding method, and it is therefore possible to form the resin layer 240 at low cost.

Moreover, the projection part 211 engages with the concave part 231, and the cap 230 that is fixed on the substrate 210 is covered with the resin layer 240. With this configuration, it is possible to suppress the resin from infiltrating to the hollow-sealed substrate 210, and ensure a sufficient area for mounting an electronic component and wiring on the substrate 210 within the hollow sealing structure 200.

The projection part 211 on the substrate 210 may be of a shape other than that described above. Examples of the shape of the projection part 231 being different from that of the exemplary embodiment described above, are described below in detail as modified example 5 and modified example 6.

Configurations are the same as those of the second exemplary embodiment described above except for the shape of the projection part 211 and the concave part 231 of the cap 230 being different. Therefore, the same reference symbols are given to the same components, and detailed descriptions thereof are omitted. The manufacturing method of the hollow sealing structure is also similar to that in the above exemplary embodiment, and therefore the detailed description thereof is omitted.

Modified Example 5

Figure 12A:
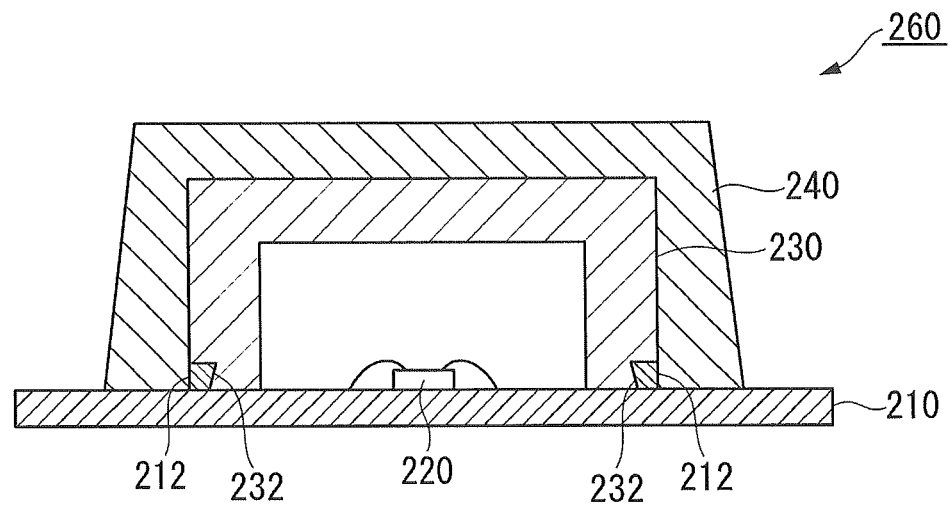
FIG. 12A is a schematic explanatory diagram of modified example 5 of the second exemplary embodiment of the present invention.
Figure 12B:
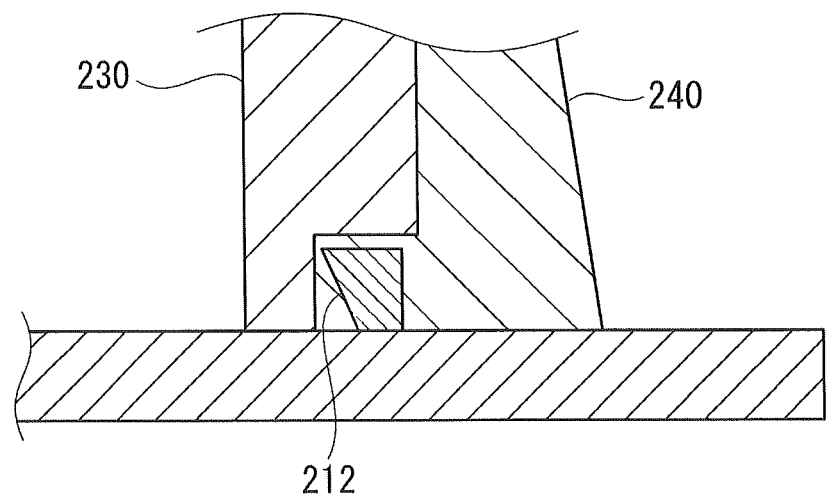
FIG. 12B is a schematic explanatory diagram of modified example 5 of the second exemplary embodiment of the present invention.

In a hollow sealing structure 260 of modified example 5, as shown in FIG. 12A and FIG. 12B, projection parts 212 are provided on a substrate 210. Each projection part 212 is of a claw shape with a small lower surface and a large upper surface. The projection part 212 is arranged so that a claw (an acute-angled portion) thereof is oriented in a direction facing an element part 220. A resin layer 240 is formed also in a gap between the projection part 212 and a concave part 232 of a cap 230.

According to the hollow sealing structure 260 of this type of configuration, the resin layer 240 is formed also in the gap between the projection part 212 and the cap 230. With this configuration, the cap 230 and the resin layer 240 are tightly and more strongly adhered with each other, and also the substrate 210 and the resin layer 240 are tightly and more strongly adhered with each other. As a result, even in a case where pressure is applied from the outside, the hollow sealing structure 260 can be maintained and the reliability thereof can be improved.

Moreover, with the projection part 212 being of a claw shape, the concave part 232 of the cap 230 can be easily engaged with the projection part 212, achieving superior workability.

Modified Example 6

Figure 13A:
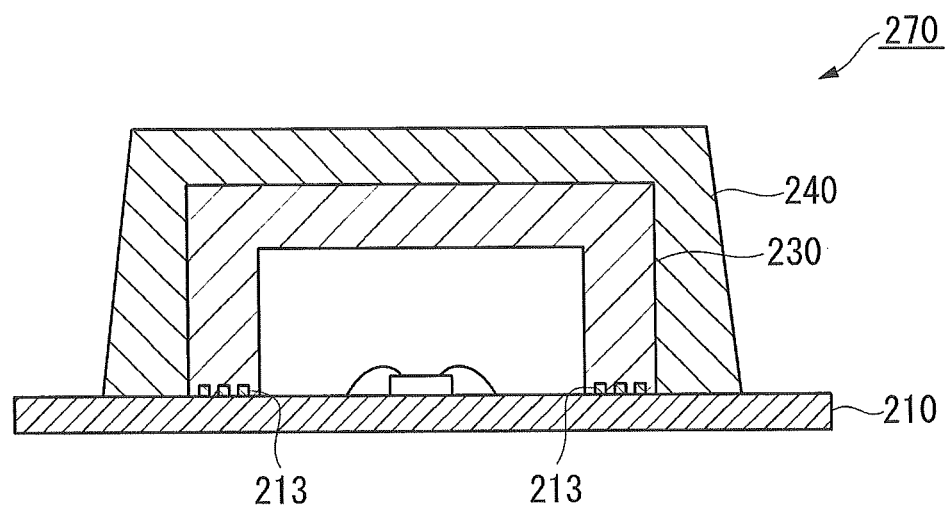
FIG. 13A is a schematic explanatory diagram of modified example 6 of the second exemplary embodiment of the present invention.
Figure 13B:
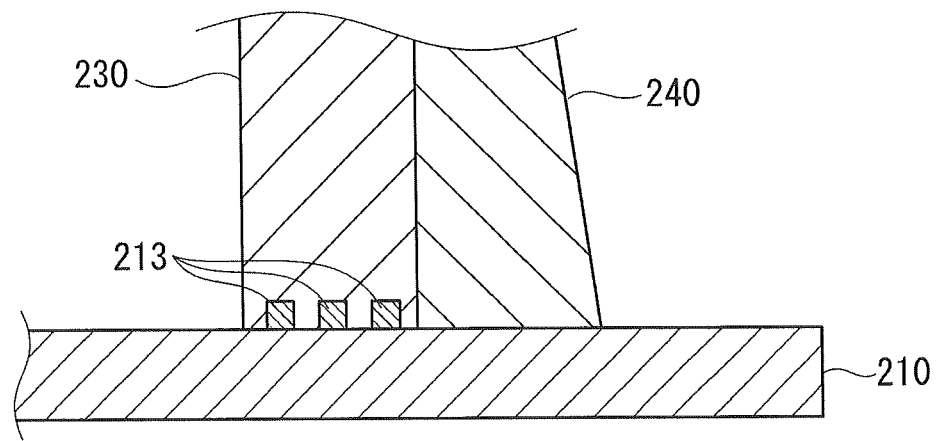
FIG. 13B is a schematic explanatory diagram of modified example 6 of the second exemplary embodiment of the present invention.

In a hollow sealing structure 270 of modified example 6, as shown in FIG. 13A and FIG. 13B, a plurality of projection parts 213 are provided on a substrate 210 (at six locations in total in the example illustrated in FIG. 13A and FIG. 13B). In a cap 230 there are provided concave parts each corresponding to the projection parts 213. Each concave part is a portion where an end surface of the cap 230 is partly recessed. The end surface of the cap 230 (the surface on which the substrate 110 and the cap 230 are in contact with each other) is a flat surface. The concave parts of the cap 230 engage with the projection parts 213 of the substrate 210, and thereby movement of the cap 230 is restricted in a direction parallel with the substrate 210 (a left-right direction or a front-rear direction in FIG. 13A and FIG. 13B).

According to the hollow sealing structure 270 with this type of configuration, the plurality of projection parts 213 and the plurality of concave parts of the cap 230 are engaged with each other, and thereby movement of the cap 230 is restricted. As a result, the position of the cap 230 will not deviate when forming the resin layer 240 by means of the transfer molding method. Accordingly, the resin layer 240 is formed at a predetermined position, thereby achieving reliable hollow sealing and improving the reliability thereof.

Moreover, the projection parts 213 and the concave parts of the cap 230 engage with each other, restricting movement in the direction parallel with the substrate 210. As a result, it is possible to reliably achieve hollow sealing without the position of the cap 230 deviating, regardless of the direction in which the side gate is provided.

These projection parts 213 on the substrate 210 may be formed as a wiring pattern. When forming the wiring pattern, a pattern that serves as the projection parts 213 may be formed. Furthermore, at a location on the substrate 210 that corresponds to each corner portion of the end part of the cap 230, there may be formed an L-shaped pattern or a ring-shaped pattern.

Moreover, in the second exemplary embodiment, through holes may be formed in the substrate 210, and a resin layer 240 may be formed also on the back surface of the substrate 210 as described in modified example 4. With this configuration, the cap 230 can be fixed more strongly.

The above is a description of the hollow sealing structure of the exemplary embodiments of the present invention. However, the invention is not limited to this, and appropriate modifications may be made without departing from the technical scope of the invention.

In the above exemplary embodiments, the numbers of the positioning parts (through holes, projection parts) and the fixation parts (projection parts, concave parts) are limited to predetermined numbers. However, the numbers of the positioning parts and the fixation parts may be one or more. Moreover, the positioning parts and the fixation parts may be appropriately provided at required locations according to conditions, at the time of forming the resin layer.

Furthermore, in the above exemplary embodiments, the element part is provided on the upper surface of the substrate. However, the element part may be provided on the lower surface of the substrate.

Moreover, in the above exemplary embodiments, the gap between the cap and the substrate can also be filled with the resin by optimally selecting the viscosity, fluidity, and filler size of the resin to be used in the transfer molding method. In this case, reliability of the hollow sealing structure can be improved.

Furthermore, in the above exemplary embodiments, there has been described the case where the projection part of the substrate is of a cylinder shape, however, it is not limited to this. The projection part of the substrate may be of a half cylinder shape, or a shape with a groove formed in the side surface of the cylinder, to thereby facilitate resin filling into the gap.

This application is based upon and claims the benefit of priority from Japanese patent application No. 2011-208642, filed Sep. 26, 2011, the disclosure of which is incorporated herein in its entirety by reference.

INDUSTRIAL APPLICABILITY

The present invention may be applied to a hollow sealing structure. A hollow sealing structure applied with the present invention is such that hollow sealing thereof is highly reliable and production thereof can be done at low cost.

REFERENCE SYMBOLS 100, 160, 170, 200, 260, 270 Hollow sealing structure
110, 210 Substrate
120, 220 Element part
130, 230 Cap
131, 132, 133, 134 Projection part (fixation part)
140, 240 Resin layer
211, 212, 213 Projection part (positioning part)
231, 232 Concave part (fixation part)

The invention claimed is:

1. A hollow sealing structure comprising a substrate, an element part provided on a first surface of the substrate, a cap that covers the element part, and a resin layer that covers the cap, wherein:
the substrate includes a positioning part positioning the cap;
the cap includes a fixation part being arranged at the positioning part and fixing the cap on the substrate; and
the resin layer is connected to the positioning part and the fixation part, wherein the resin layer passes through a through hole differing from the positioning part and is connected to a second surface of the substrate, the second surface being an opposite surface of the first surface.

2. The hollow sealing structure according to claim 1, wherein:
the positioning part comprises a hole provided in the substrate; and
the fixation part comprises a projection part provided on the cap.

3. The hollow sealing structure according to claim 1, wherein:
the positioning part comprises a projection part provided on the substrate; and
the fixation part comprises a concave part provided in the cap.

4. The hollow sealing structure according to claim 1, wherein the fixation part is provided near an outside of an end surface of the cap, and the end surface of the cap being in contact with one surface of the substrate is a flat surface.

5. The hollow sealing structure according to claim 1, wherein the resin layer is formed by a transfer molding method.

\* \* \* \* \*